(12) United States Patent
Huang et al.

(10) Patent No.: US 6,281,143 B1
(45) Date of Patent: Aug. 28, 2001

(54) METHOD OF FORMING BORDERLESS CONTACT

(75) Inventors: Michael W C Huang, Hsin-Tien; Hsueh-Hao Shih; Gwo-Shii Yang, both of Hsin-Chu; Tri-Rung Yew, Chu-Tung Chen, all of (TW)

(73) Assignee: United Microelectronics Corp., Hsin-Chu City (TW)

( * ) Notice: Subject to any disclaimer, the term of this patent is extended or adjusted under 35 U.S.C. 154(b) by 0 days.

(21) Appl. No.: 09/334,864

(22) Filed: Jun. 17, 1999

(51) Int. Cl.[7] .................... H01L 21/31; H01L 21/469; H01L 21/425; H01L 21/44
(52) U.S. Cl. .................. 438/775; 438/791; 438/769; 438/597; 438/533
(58) Field of Search .................. 438/740, 738, 438/775, 597, 233, 523, 533, 791, 986, 970, 769, 621

(56) References Cited

U.S. PATENT DOCUMENTS

| | | | |
|---|---|---|---|
| 5,474,953 | * 12/1995 | Shimizu et al. | 437/67 |
| 5,821,153 | * 10/1998 | Tsai et al. | 438/439 |
| 5,827,764 | * 10/1998 | Liaw et al. | 438/238 |
| 5,948,702 | * 9/1999 | Rotundaro | 438/707 |
| 6,066,555 | * 5/2000 | Nulty et al. | 438/738 |

* cited by examiner

*Primary Examiner*—Richard Elms
*Assistant Examiner*—Adam Pyonin

(57) ABSTRACT

A method for forming borderless contact is disclosed. The method includes providing a substrate with active areas and a trench isolation region in which the active areas are silcide. Then, the substrate is nitridized such that a titanium nitride layer is formed on the active areas and a silicon oxynitride is formed on the trench isolation region. A dielectric layer is deposited on the substrate and an opening is etched in the dielectric layer in which the opening overlies both a portion of the trench isolation region and a portion of the active area.

17 Claims, 4 Drawing Sheets

METHOD OF FORMING BORDERLESS CONTACT

BACKGROUND OF THE INVENTION

1. Field of the Invention

The present invention relates to semiconductor manufacturing in general, and more specifically to methods for forming borderless contact.

2. Description of the Prior Art

The major objectives of the semiconductor industry have been to continually increase the device and circuit performances of silicon chips, while maintaining or even decreasing the cost of producing these same silicon chips. These objectives have been successfully addressed by the ability of the semiconductor industry to fabricate silicon devices, with sub-micron features. The ability to use sub-micron features, or micro-miniaturization, has allowed performance improvements to be realized by the reduction of resistances and parasitic capacitances, resulting from the use of smaller features. In addition, the use of sub-micron features, results in smaller silicon chips with increased circuit densities, thus allowing more silicon chips to be obtained from a starting silicon substrate, thus reducing the cost of an individual silicon chip.

The attainment of micro-miniaturization has been basically a result of advances in specific semiconductor fabrication disciplines, such as photolithography and reactive ion etching. The development of more sophisticated exposure cameras, as well as the use of more sensitive photoresist materials, have allowed sub-micron features in photoresist layers to be routinely achieved. In addition, similar developments in the dry etching discipline have allowed these sub-micron images in photoresist layers to be successfully transferred to underlying materials, which are used for the creation of advanced semiconductor devices. However, the use of sub-micron features can improve silicon device performance and decrease silicon chip cost, but will introduce specific semiconductor fabrication problems that would be encountered by larger featured counterparts. For example, specific designs, which are used to connect an overlying metallization structure to an underlying metallization structure, sometimes require that metal filled via holes in insulator layers, and not always be fully landed. That is the metal filled via, not being placed entirely on the underlying metallization structure. The inability to fully land a via on an underlying metal structure places a burden on the process used to create the via hole. For example if the chip design demands a non-fully landed, or a borderless contact, the dry etching procedure used to create the via has to be able to insure complete removal of insulator material from the area where the via landed on the underlying metal structure. Therefore, the dry etching procedure necessitates the use of an overetch cycle.

However, the overetching can create problems. FIG. 1A to FIG. 1D are schematic representations of structures at various stages during the formulation of borderless contact using conventional, prior art techniques. A substrate 100 is provided with a source/drain junction 110 formed therein, as shown in FIG. 1A. A shallow trench isolation (STI) 120 is formed beside the junction 110. Then, a silicon nitride layer 140 is deposited on the substrate 100 as a stop layer, as shown in FIG. 1B. A planarized interlevel dielectric layer 150 is subsequently formed over the stop layer 140. The formulation of contact includes two etching steps, i.e., etching interlevel dielectric layer 150 is the first and etching stop layer 140 is the second. FIG. 1C shows the first step and FIG. 1D shows the second step. While in the second step, the selectivity between silicon nitride and silicon oxide is about 1.5:1. This will make overetching on top surface of STI 120 near bottom of junction 110, and leakage current will occur between side wall of STI 20 and substrate 100 when a tungsten or a copper plug fills the contact 160, as shown in FIG. 1D.

SUMMARY OF THE INVENTION

In accordance with the present invention, a method is provided for forming borderless contact that substantially simplifies the process by reducing one etching blanket silicon nitride step.

It is another object of this invention to minimize the trench isolation loss.

It is a further object of this invention that no silicon nitride stress issue on source/drain to cause device impact.

In one embodiment, a substrate is provided with active areas and a trench isolation region in which the active areas are silicide. Then, the substrate is nitridized so that a titanium nitride layer is formed on the active areas and a silicon oxynitride is formed on the trench isolation region. This nitridation is performed by applying $NH_3$ gas after/with rapid thermal process 2 of salicide process. A dielectric layer is deposited on the substrate and an opening is etched in the dielectric layer in which the opening overlies both a portion of the trench isolation region and a portion of the active area.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
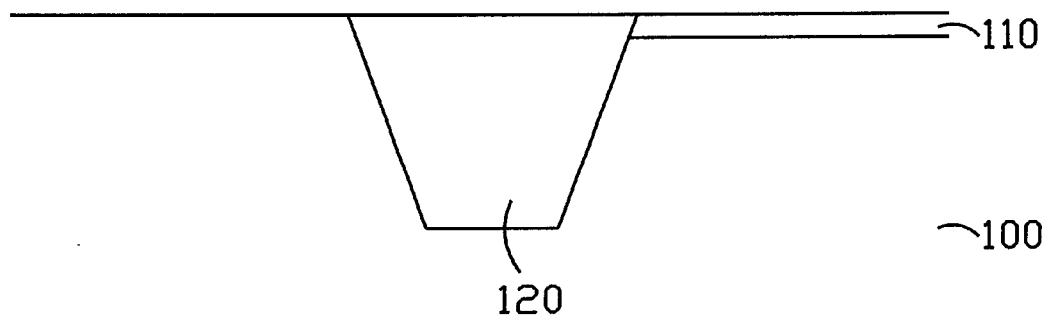
FIGS. 1A to 1D are schematic representations of structures at various stages during the formulation of borderless contact using conventional, prior art techniques.
Figure 1B:
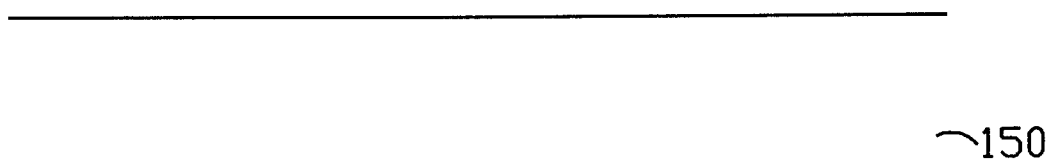
Figure 1B:
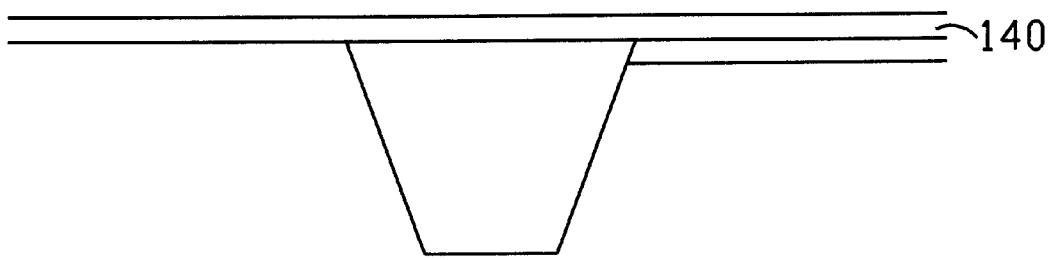
Figure 1C:
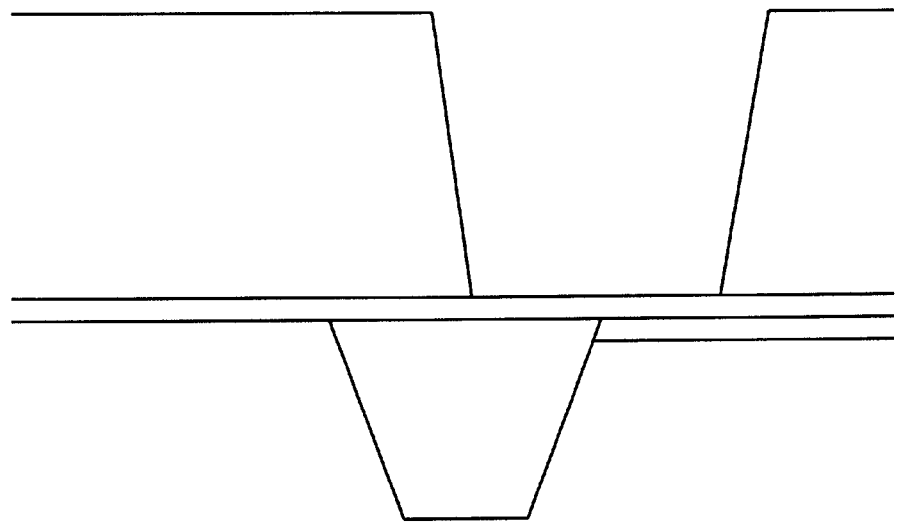
Figure 1D:
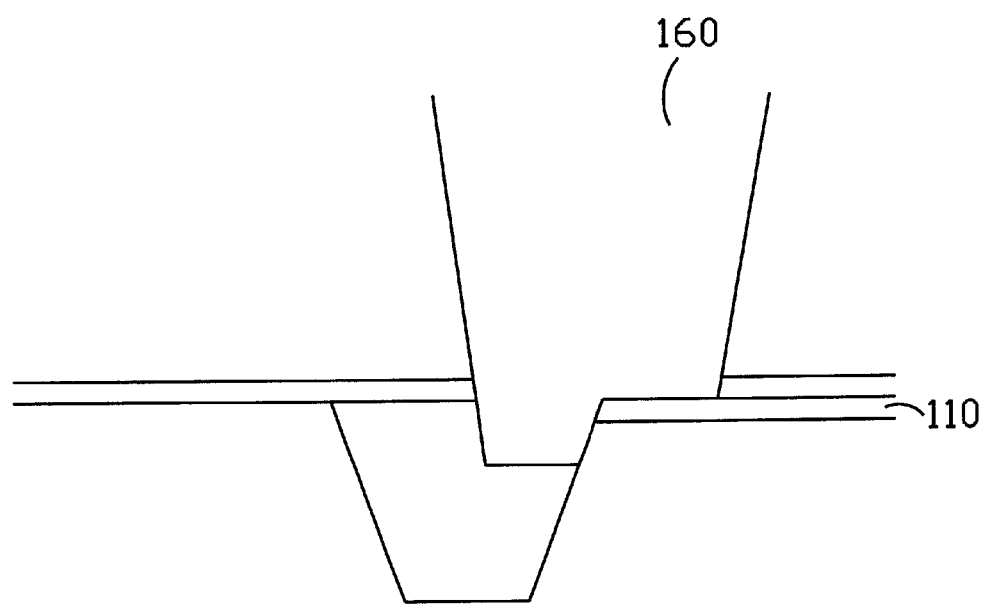
Figure 2A:
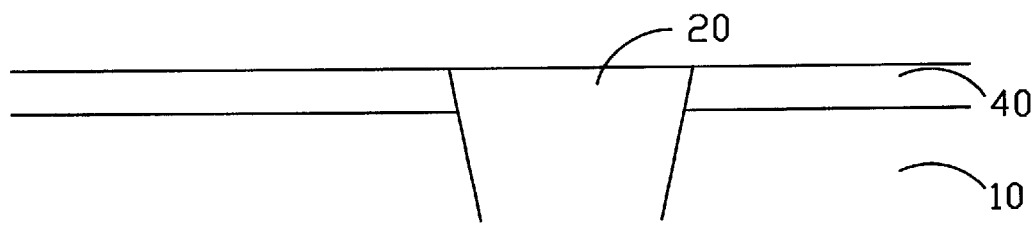
FIGS. 2A to 2D are schematic representations of structures at various stages during the formulation of borderless contact in accordance with a method disclosed.

Referring to FIG. 2A, a substrate 10 is provided with a silicide layer 40 formed on the surface of active areas which may be a component of a metal-oxide-semiconductor transistor. This silicide layer 40 is formed using any conventional salicide process and comprises titanium silicide. The trench isolation region 20 is formed in the substrate 10 by any suitable method to isolate the active areas and the material of this trench isolation is silicon oxide.

Figure 2B:
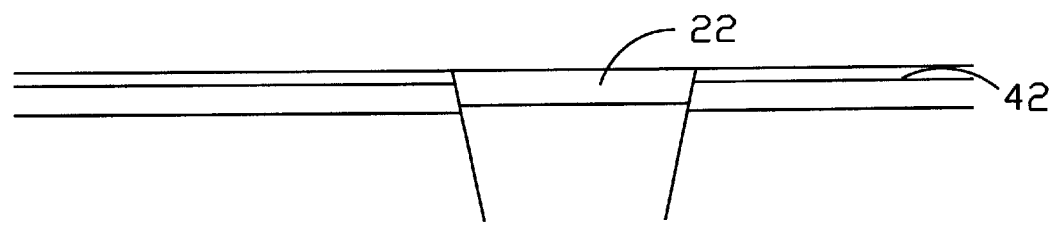

Then, as a key point of this invention, the substrate 10 is nitridized to form a titanium nitride layer 42 on the active areas and a silicon oxynitride layer 22 on the trench isolation region 20, as shown in FIG. 2B. Any nitridizing process may be preformed, however, two methods are described in this invention.

Referring to conventional salicide process, there are two rapid thermal processes after depositing titanium on the substrate 10. Rapid thermal process 1 is used for titanium and silicon reaction and rapid thermal process 2 is used for phase transition such that titanium silicide will change phase from C49 to C54. One method is in-situ applying $NH_3$ gas to substrate 10 at rapid thermal process 2. During the $NH_3$ anneal, a thin titanium nitride layer 42 will also be formed on the active areas by consuming a little Ti-salicide and a thin silicon oxynitride layer 22 is formed on the trench isolation region 20 by consuming a little silicon oxide. In this embodiment, the thickness of this titanium nitride layer 42 is between about 75 to 125 angstroms and the thickness of this silicon oxynitride layer 22 is between about 100 to 200 angstroms. The duration of this $NH_3$ treatment is between about 10 to 100 seconds and the temperature is between about 950° C. to 975° C. The flow rate of $NH_3$ gas in $NH_3$ treatment is between 0.2 to 10 SLM.

Another nitrdizing process is applying $NH_3$ gas to substrate after rapid thermal process 2. To prevent further salicidation to degrade junction leakage, a plasma enhanced chemical vapor deposition is preferred so that the nitridation temperature can be reduced to below about 600° C. to 800° C. The thickness of both titanium nitride layer 42 and silicon oxynitride layer 22 is the same with paragraph described above.

Figure 2C:
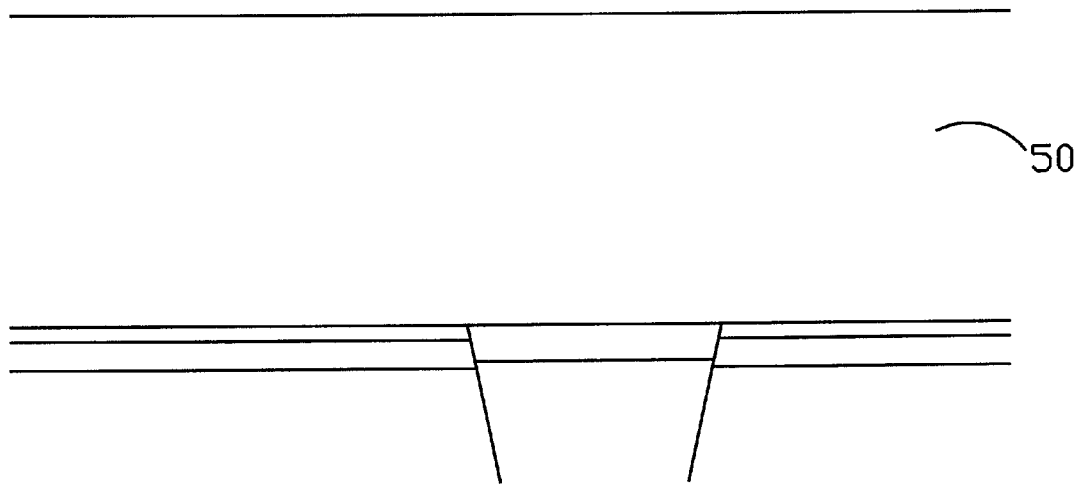

Referring to FIG. 2C, an inter-level dielectric layer 50 is deposited on and can be a silicon oxide, a phosphorus glass (PSG), boronphosphorus glass (BPSG), or TEOS. The formulation of this layer 50 may be chemical vapor deposition, low pressure chemical vapor deposited (LPCVD), or high density plasma (HDP) chemical vapor deposition. Then, the interlevel dielectric layer 50 is planarized using any conventional method, such as chemical mechanical polishing, and has a thickness between about 7000 to 10000 angstroms.

Figure 2D:
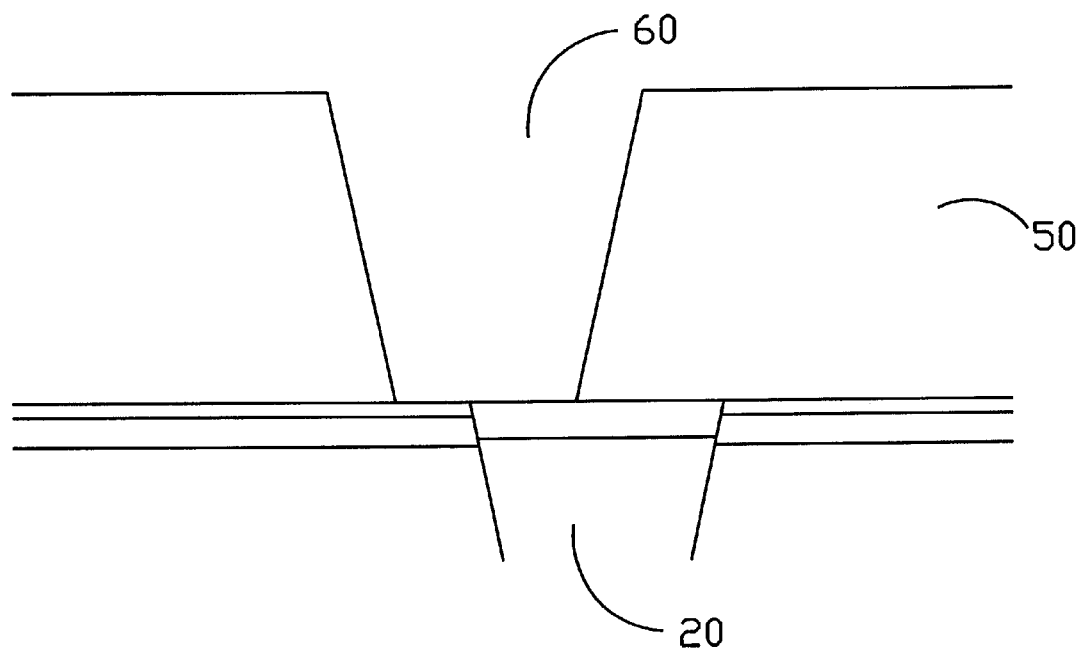

Referring to FIG. 2D, a portion of the inter-level dielectric layer 50 is etched to form a borderless contact hole 60 by using any conventional method such as conventional anisotropical dry etching. The hole 60 overlies a portion of the active areas and a portion of the trench isolation region 20. This etching will cease on titanium nitride layer 42 of the active areas and silicon oxynitride layer 22 of the trench isolation region 20 while overetching. Because there is no blanket silicon nitride layer compared to the prior art in this invention, the process is simplified by reducing an etching silicon nitride step.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:
   providing a substrate having active areas and a trench isolation region, wherein said active areas are silicide;
   nitridizing said substrate such that a titanium nitride layer is formed on said active areas and a silicon oxynitride is formed on said trench isolation region;
   forming a dielectric layer on said substrate; and
   etching an opening in said dielectric layer, wherein said opening overlies both a portion of said trench isolation region and a portion of said active area.

2. The method according to claim 1, wherein said step of nitridizing is applying $NH_3$ gas on said substrate after rapid thermal process in salicide process.

3. The method according to claim 2, wherein said method of applying $NH_3$ gas comprises plasma enhanced chemical vapor deposition method.

4. The method according to claim 3, wherein the temperature of said plasma enhanced chemical vapor deposition is between about 600 to 800° C.

5. The method according to claim 1, wherein said step of nitridizing is applying $NH_3$ gas on said substrate at rapid thermal process in salicide process.

6. The method according to claim 5, wherein the temperature of said nitridizing is between about 950 to 975° C.

7. The method according to claim 1, wherein said silicide is produced by salicide process.

8. The method according to claim 1, wherein said dielectric layer comprises silicon oxide.

9. A method for forming a semiconductor device, the method comprising:
   providing a substrate having active areas and a trench isolation region, wherein said active areas are silicide by using a salicide process;
   applying $NH_3$ gas after the salicide process such that a titanium nitride layer is formed on said active areas and a silicon oxynitride is formed on said trench isolation region;
   forming a dielectric layer on said substrate; and
   etching an opening in said dielectric layer, wherein said opening overlies both a portion of said trench isolation region and a portion of said active area.

10. The method according to claim 9, wherein said method of applying $NH_3$ gas comprises plasma enhanced chemical vapor deposition method.

11. The method according to claim 10, wherein the temperature of said plasma enhanced chemical vapor deposition is between about 600 to 800° C.

12. The method according to claim 9, wherein said silicide is produced by salicide process.

13. The method according to claim 9, wherein said dielectric layer comprises silicon oxide.

14. A method for forming a semiconductor device, said method comprising:
   providing a substrate having active areas and a trench isolation region;
   in-situ applying $NH_3$ gas at rapid thermal process 2 of salicide process such that a titanium nitride layer is formed on said active areas and a silicon oxynitride is formed on said trench isolation region;
   forming a dielectric layer on said substrate; and
   etching an opening in said dielectric layer, wherein said opening overlies both a portion of said trench isolation region and a portion of said active area.

15. The method according to claim 14, wherein the temperature of said rapid thermal process 2 is between about 950 to 975° C.

16. The method according to claim 14, wherein said silicide is produced by salicide process.

17. The method according to claim 14, wherein said dielectric layer comprises silicon oxide.

* * * * *